US012620424B2

(12) United States Patent
Kumar Krovi et al.

(10) Patent No.: US 12,620,424 B2
(45) Date of Patent: May 5, 2026

(54) STORAGE SYSTEM LATCH CONTROL

(71) Applicant: Arm Limited, Cambridge (GB)

(72) Inventors: Sunil Kumar Krovi, Bangalore (IN); Dharmesh Kumar Sonkar, Bangalore (IN); Rangavdhoot Bhupendrakumar Rawal, Bangalore (IN)

(73) Assignee: Arm Limited, Cambridge (GB)

( * ) Notice: Subject to any disclaimer, the term of this patent is extended or adjusted under 35 U.S.C. 154(b) by 120 days.

(21) Appl. No.: 18/610,387

(22) Filed: Mar. 20, 2024

(65) Prior Publication Data

US 2025/0246219 A1 Jul. 31, 2025

(30) Foreign Application Priority Data

Jan. 30, 2024 (IN) .............................. 202411006050

(51) Int. Cl.
*G11C 7/10* (2006.01)
*G11C 7/22* (2006.01)

(52) U.S. Cl.
CPC .............. *G11C 7/222* (2013.01); *G11C 7/106* (2013.01); *G11C 7/1069* (2013.01)

(58) Field of Classification Search
CPC ...................................................... G11C 7/106
See application file for complete search history.

(56) References Cited

U.S. PATENT DOCUMENTS

2020/0118617 A1* 4/2020 Kumar .................... G11C 7/08

* cited by examiner

*Primary Examiner* — Hoai V Ho
(74) *Attorney, Agent, or Firm* — DeWitt LLP

(57) ABSTRACT

A storage system and circuits therefor. A storage system includes a bitcell array comprising a plurality of storage cells arranged in one or more columns and one or more rows; a latch circuit configured to output a latch signal responsive to a latch control signal and a data signal from a global data line during a read operation of a storage cell of the plurality of storage cells; a latch control circuit configured to provide the latch control signal to the latch circuit, where the latch control circuit comprises a first signal propagation path for a first mode of operation and a second signal propagation path for a second mode of operation, and wherein the first signal propagation path is to delay propagation of a pulse signal through the first signal propagation path by a time ($\Delta t$) compared to a propagation of the pulse signal through the second propagation path.

15 Claims, 11 Drawing Sheets

200

S202
START

Provide storage circuitry comprising one or more bitcell arrays
S204

Provide latch control circuitry having a first signal propagation line
and a second signal propagation line
S206

Provide latch circuit to receive signals from the first and second signal
propagation lines
S208

S210
END

STORAGE SYSTEM LATCH CONTROL

CLAIM TO PRIORITY

This application claims priority to Indian application Ser. No. 202411006050 filed Jan. 30, 2024, the entire disclosure of which is incorporated herein by reference.

TECHNICAL FIELD

The present techniques relate to a storage system and circuits therefor. In particular, the present techniques relate to circuits for providing a latch control signal for such storage circuits.

BACKGROUND

A memory circuit may consist of an array of storage or memory cells, where a read bit line (RBL) is coupled to an internal node of a storage cell to allow the data value stored in that storage cell to be read during a read operation.

When the RBL is addressed during a read operation, a voltage on the bit line (BL) will either stay at a first voltage level, or will discharge towards a second voltage level, depending on the value stored within the particular storage cell. During a period that a read word line signal is asserted, a sense amplifier connected to the RBL will monitor the voltage on the RBL, and when the voltage transitions to a threshold voltage level between the first and second voltage levels during the read operation, the sense amplifier will determine that the storage cell stores a first value, whilst if it does not transition to the threshold voltage level the sense amplifier will determine that the storage cell stores a second value.

During the read operation, a latch circuit receives a latch control signal and data signal and outputs a latch signal in response thereto. The timing of the arrival of the latch control signal and data signal is important for the performance of the storage circuit.

SUMMARY

The present techniques relate to addressing or mitigating performance issues in storage circuits having latch circuits.

In a first approach there is provided a storage system comprising: a bitcell array comprising a plurality of storage cells arranged in one or more columns and one or more rows; a latch circuit configured to output a latch signal responsive to a latch control signal and a data signal from a global data line during a read operation of a storage cell of the plurality of storage cells; a latch control circuit configured to provide the latch control signal to the latch circuit, where the latch control circuit comprises a first signal propagation path for a first mode of operation and a second signal propagation path for a second mode of operation, and wherein the first signal propagation path is to delay propagation of a pulse signal through the first signal propagation path by a time ($\Delta t$) compared to a propagation of the pulse signal through the second propagation path.

In a further approach there is provided a latch control circuit for a storage system configured to provide: a latch control signal to a latch circuit, where the latch control circuit comprises a first signal propagation path for a first mode of operation and a second signal propagation path for a second mode of operation, and where the first signal propagation path is to delay propagation of a pulse signal through the first signal propagation path by a time $\Delta t$ compared to a propagation of the pulse signal through the second propagation path.

In a further approach there is provided method of operating a storage system, the storage system comprising a latch control circuit to provide a latch control signal to a latch circuit during a read operation, the latch circuit having a first mode of operation and second mode of operation, the method comprising: providing a pulse signal as an input to a first signal propagation path in the first mode of operation or providing the pulse signal as an input to a second signal propagation path in a second mode of operation, wherein the first signal propagation path is to delay propagation of the pulse signal through the first signal propagation path by a time $\Delta t$ compared to propagation of the pulse signal through the second signal propagation path.

In a further approach there is provided a method of providing a latch control circuit for a storage system, the latch control circuit having a first signal propagation path and a second signal propagation path, where the properties or characteristics of the first signal propagation path are defined to delay propagation of a pulse signal through the first signal propagation path by a time $\Delta t$ compared to a propagation of the pulse signal through the second signal propagation path.

In a further approach there is provided a system comprising: the above circuitry, implemented in at least one packaged chip; at least one system component; and a board, wherein the at least one packaged chip and the at least one system component are assembled on the board.

In a further approach there is provided a chip-containing product comprising the above system assembled on a further board with at least one other product component.

In a further approach there is provided a non-transitory computer-readable medium to store computer-readable code for fabrication of the above circuitry.

BRIEF DESCRIPTION OF THE DRAWINGS

Implementations of the disclosed technology will now be described, by way of example only, with reference to the accompanying drawings, in which.

DETAILED DESCRIPTION

Various implementations described herein are directed to latch control circuitry for a storage circuit and such applications.

Figure 1:
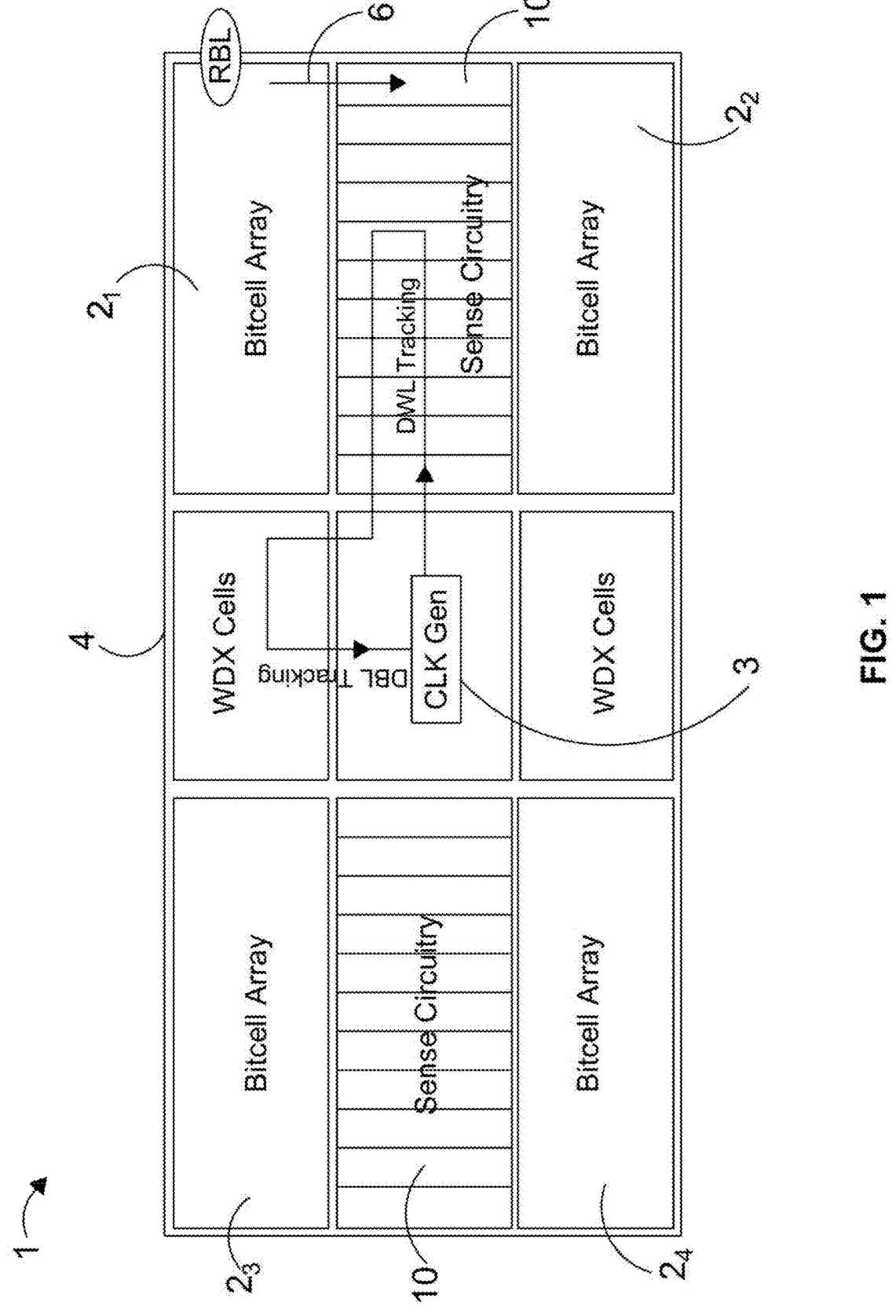
FIG. 1 shows a simplified view of a storage system.
Figure 2A:
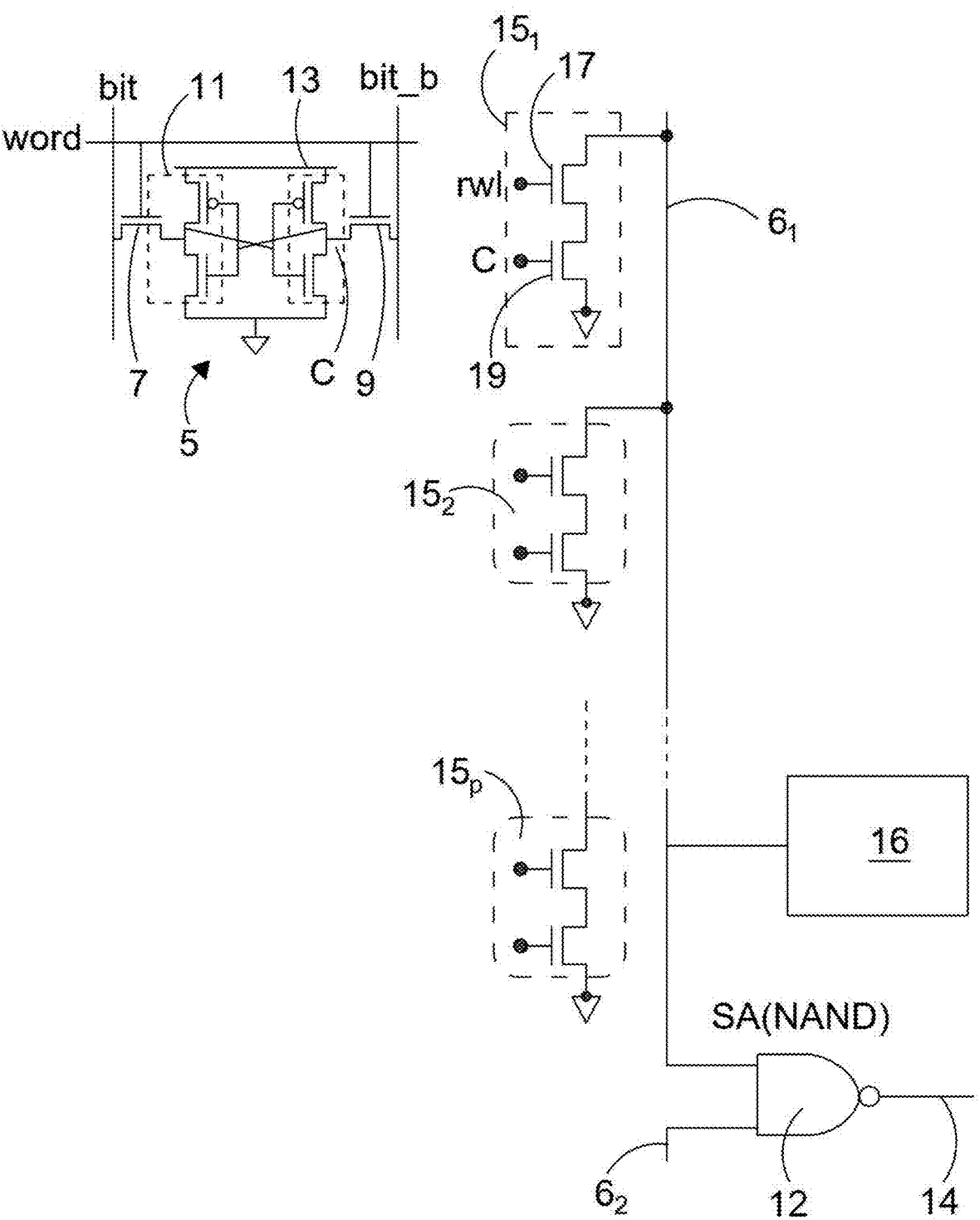
FIG. 2a shows a simplified diagram of a read bit line of the storage system of FIG. 1.
Figure 2B:
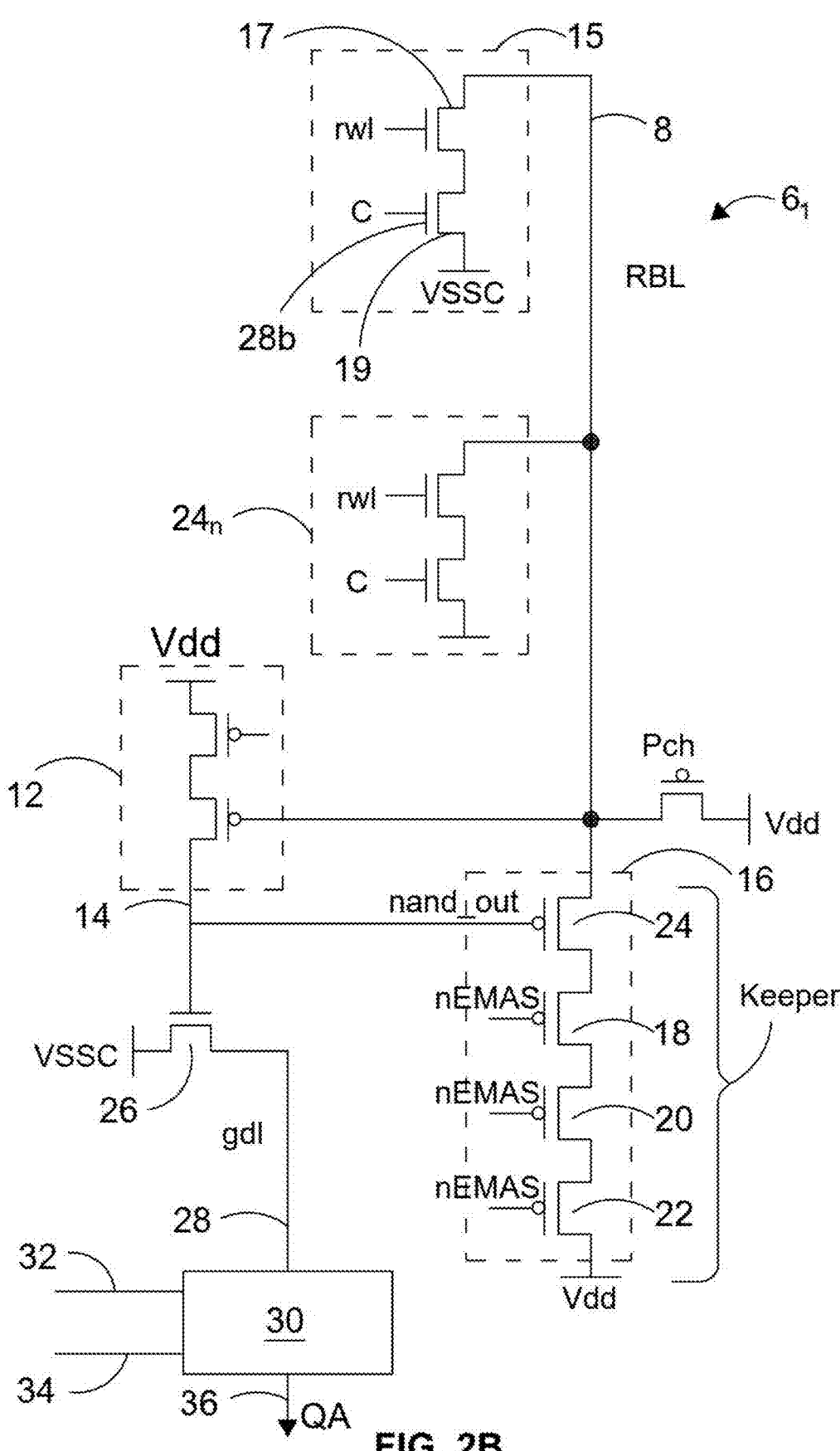
FIG. 2b shows a more detailed diagram of a read bit line of the storage system of FIG. 1.
Figure 2C:
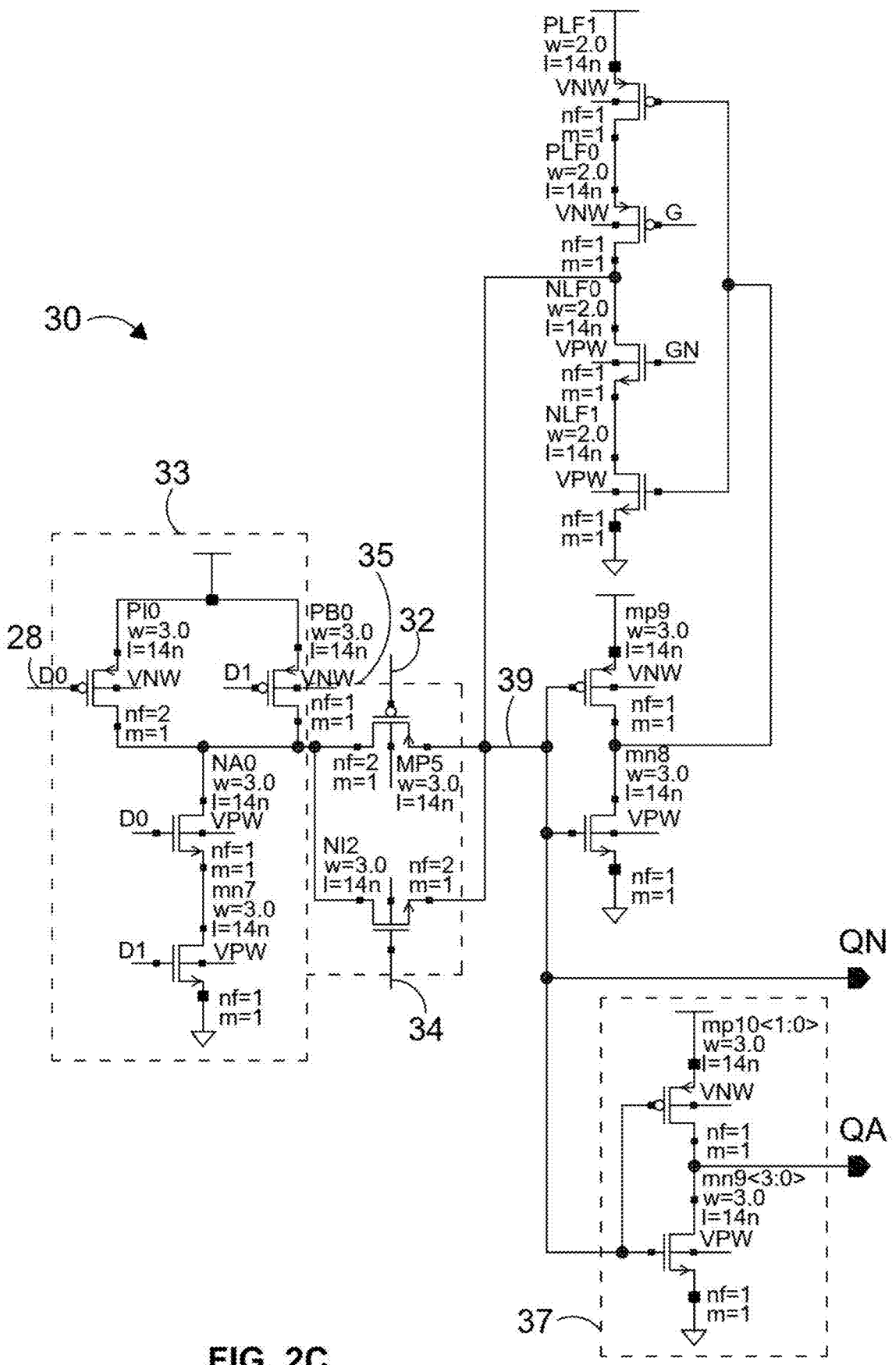
FIG. 2c shows a circuit level diagram of an example latch circuit.

FIG. 1 shows a simplified view of a storage system 1. FIG. 2*a* shows a simplified diagram of a read bit line 6$_1$ of the storage system 1, FIG. 2*b* shows a more detailed diagram of the read bit line 6$_1$ of storage system 1 and FIG. 2*c* shows a circuit level diagram of an example latch circuit 30.

In the following examples the storage system 1 comprises a single ended storage circuit, and may include Read-only memory (ROM) storage circuits, RF2P (register file dual port) or any storage circuits having a single read port.

Figure 3:
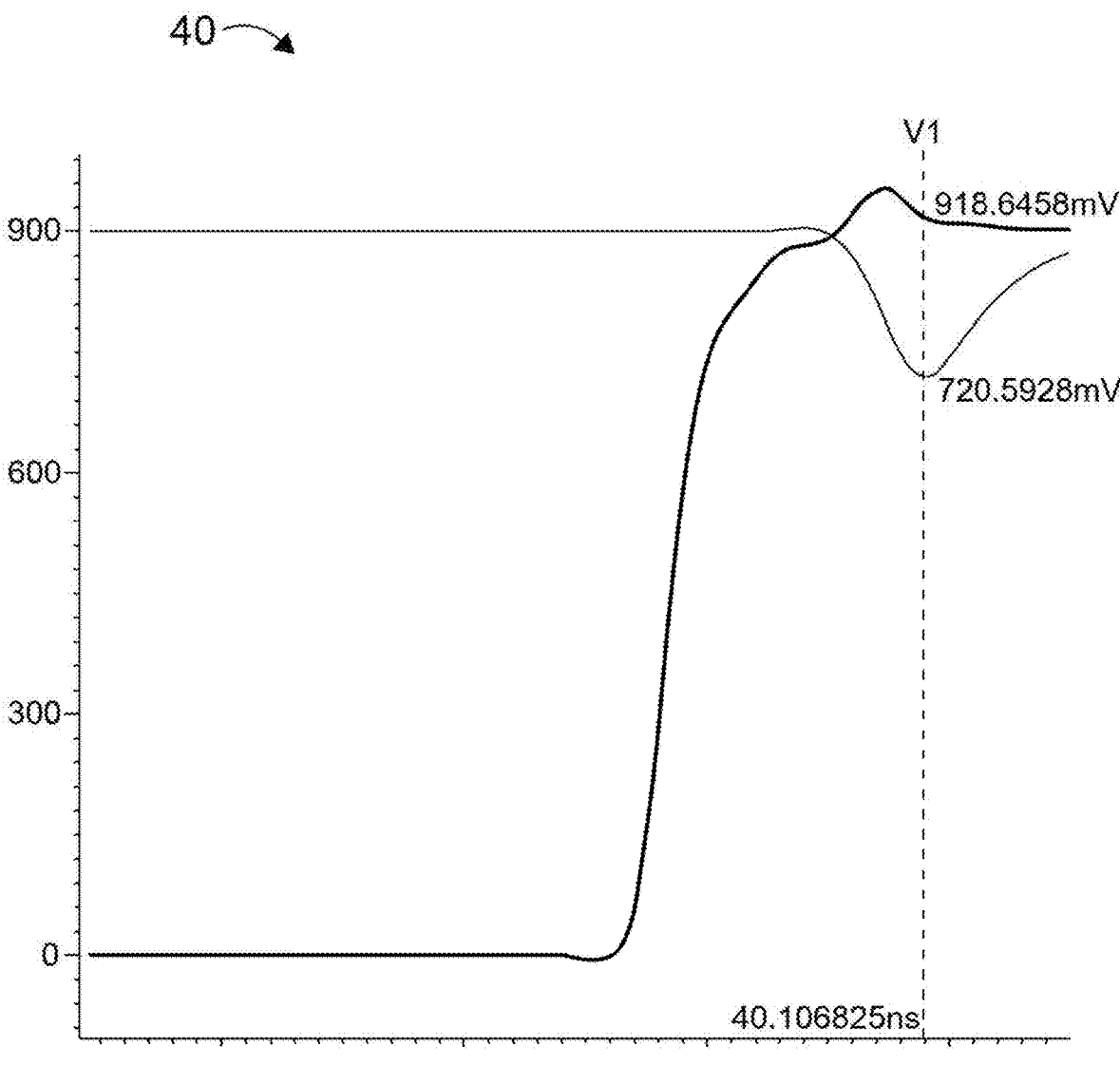
FIG. 3 is a graph which is representative of an internal node of a latch circuit during a latch operation.

The storage system 1 comprises various components and circuits, an overview of which is provided in FIGS. 1 to 3. Whilst in an embodiment the storage system 1 may comprise a single block structure, in an alternative embodiment multiple block structures (e.g. bitcell array blocks, WDX cell blocks, sense circuitry blocks, clock generation block), may be used to form the storage system 1 such as depicted in FIG. 1.

Storage system 1 comprises one or more bitcell arrays 2$_n$ (four of which 2$_1$-2$_4$ are depicted in FIG. 1), where each bitcell array 2$_n$ comprises a plurality of storage cells 5 (depicted in FIG. 2*a*) arranged as a plurality of rows and columns therein, each row of a particular bitcell array 2$_n$ being coupled to an associated read word line (RWL) (not shown in FIG. 1) to provide access to the storage cells coupled thereto in a read or write operation, and each column of storage cells of a particular bitcell array 2$_n$ being coupled to an associated read bit line (RBL) to provide access to the storage cells coupled thereto in a read or write operation.

Considering the block structure of FIG. 1, four bitcell arrays are depicted, two (2$_1$ and 2$_2$) on the right-hand side of FIG. 1 and two (2$_3$ and 2$_4$) on the-left hand side of FIG. 1.

Accordingly, in this embodiment each column of storage cells within the top bitcell array 2$_1$ will be connected to an associated RBL 6, and each column of storage cells within the bottom bitcell array 2$_2$ will also be connected to an associated, different, RBL (depicted as "Bottom RBL" in FIG. 2*a*).

Looking at the right-hand side, and at the top bitcell array 2$_1$ and the bottom bitcell array 2$_2$, both of these bitcell arrays share the same sense circuitry 10$_1$. Looking at the left-hand side, and at the top bitcell array 2$_3$ and the bottom bitcell array 2$_4$, both of these bitcell arrays share the same sense circuitry 10$_2$. Such sense circuitry may comprise sense amplifiers to receive a signal from a respective RBL (i.e. a rbl signal) and to output a sense circuit output to, for example, a global data line (GDL) 28 (see FIG. 2*b*). In an illustrative example a sense amplifier comprises a NAND gate structure 12 to produce a consolidated sense amplifier output for a pair of RBLs (i.e. a first RBL for a column of storage cells of the first bitcell array and a second RBL for a column of storage cells of the second bitcell array).

The storage system 1 may include clock generation circuitry 3 that may receive a clock signal CLK (e.g. an external clock signal) and may provide an internal clock signal as a global timing pulse (gtp) signal to various functional units to initiate a particular operation, such as enabling various column access drivers and read/write controllers. The gtp (or an inverted or modified form of it i.e. ngtp or ngtpa) may, for example, be provided to a latch circuit 30 (see FIG. 2*c*) as a latch control signal to cause the latch circuit to output a latch signal QA as will be described below. The timing of the arrival of the latch control signal is important for the performance (e.g. efficiency, effectiveness, validity) of the read operation as will be described below.

The storage system 1 may also include row decoder circuitry (not shown), wordline driver circuitry (not shown), and a column multiplexer circuitry (not shown). In some instances, the row decoder may be used to access each bitcell of a bitcell array 2$_n$ via a selected wordline that is driven by the wordline driver (not shown). In the present embodiments the combination of the row decoder and the wordline driver are depicted as WDX cells 4.

For a read operation of a storage cell of bitcell array 2$_1$, the rwl signal will be asserted to activate the storage cells within an addressed row of the bitcell array 2$_1$, and accordingly considering a particular pair of top RBLs 6$_1$ and bottom RBLs 6$_2$, where (only) the addressed storage cell connected to those pair of RBLs 6$_1$ or 6$_2$ will be activated via the respective read access logic 15$_1$-15$_p$ along the RBL 6$_1$ (where P is an integer ≥1).

During the read operation, the addressed storage cell will discharge the voltage on its associated RBL towards the logical LOW or low voltage level (typically a ground voltage level (VSS)) when a data value stored in that activated or addressed storage cell has a first value. If instead the data value in the activated or addressed storage cell is at a second value, no such discharging will be performed and the RBL will remain at the logical HIGH or high voltage level (typically VDD). The voltage levels may be set by a user dependent on requirement. For example, a first user may require the storage system to operate in a first voltage domain (e.g. VDD=1.1V) whereas another user may require the storage system to operate in a second voltage domain (e.g. VDD=0.6V). The claims are not limited to the example voltage domains above, and other voltage domains are possible, for example, (e.g. 0.5V etc.)

Due to the operation of the NAND gate structure 12, it will be appreciated that the sense output signal 14 will remain at a logic zero value (or LOW) when neither of the pair of RBLs is discharged, but will flip to a logic one value (of HIGH) when either one of the RBLs is discharged towards a logic zero level.

Therefore, when the activated storage cell stores the first value, the sense amplifier output 14 should flip from a logic zero value to a logic one value during the period whilst the rwl pulse signal is asserted, and the load access logic is enabled but when the activated storage cell stores the second value the sense amplifier output should not flip, and instead should remain at the logic zero level.

Looking at FIGS. 2*a* & 2*b*, RBL 6$_1$ provides one input to the NAND gate 12. The bottom read bit line 6$_2$ provides a further input and will have the same arrangement of components connected to it as are shown in FIG. 2*a* in respect of the top read bit line 6$_2$.

FIG. 2*a* depicts an example storage cell 5, which in the present illustrative example comprises a 6 transistor (6T) arrangement. However, the claims are not limited in this respect and any suitable arrangement or number of transistors may be used for storage cell 5.

The storage cell depicted in FIG. 2*a* comprises two N-type Metal Oxide Semiconductor (NMOS) pass gate transistors 7, 9 and two pairs of NMOS and P-type Metal Oxide Semiconductor (PMOS) transistor arranged as two inverters 11, 13, but in addition read access circuitry (or coupling circuitry) $15_1$ comprising first and second transistors 17, 19 is also provided for use during a read operation. In the read access circuitry $15_1$ depicted in FIG. 2a the first and second transistors 17, 19 are depicted as NMOS transistors but the claims are not limited in this respect. In the read access circuitry depicted in FIG. 2a the first transistor 17 is controlled by read word line (rwl) signal and the second transistor 19 is controlled by a signal (depicted as "cored") which is provided by or obtained from an internal bitcell node (depicted as "C" in FIG. 2a) of the addressed storage cell.

During such a read operation of an addressed storage cell, a rwl signal on the transistor 17 will be asserted (E.g. by control logic), turning on the transistor 17 of the read access circuitry 15 and the RBL $6_1$ may selectively discharge towards the logic zero (or LOW) level dependent on the value stored at the node C within the addressed storage cell 5. For example, when the node C of the addressed storage cell stores a first value, namely a logic one (or HIGH) value, this will turn on the NMOS transistor 19, and cause the RBL $6_1$ to be discharged towards ground. Conversely, when the node C stores a logic zero value, the NMOS transistor 19 will not be turned on, and the voltage on the bit line should remain at the Vdd level. The sense amplifier output 14 will initially have an output at a logic zero level, but as discussed earlier that output will flip to a logic one level during the course of the read operation when the node C stores a logic one value and hence the RBL $6_1$ is discharged.

It will be noted that multiple storage cells are coupled to the read bit line $6_1$, each having associated read access circuitry $15_1$ to $15_p$. As device geometries shrink, it has been found that the leakage current through the read access circuitry has become more significant. In particular, whilst only one of the read access circuitry $15_1$ to $15_p$ within the column will have its transistor 17 turned on by an asserted read word line signal, the read access circuitry of the other non-addressed storage cells coupled to the RBL may contribute to leakage current. The most significant cause of the leakage current is from non-addressed memory cells that store at their respective nodes C a logic one value. In this situation, although the read access transistors 17 of the non-addressed storage cells are turned off, the read access transistors 19 of the non-addressed storage cells are turned on (due to the HIGH value at node C of the storage cells), and leakage current through the read access circuits $15_1$ to $15_p$ in that situation may pull the voltage on the RBL down towards the logic zero level. Some further leakage current may also occur in non-addressed memory cells where the node C stores a logic zero value, and indeed in connection with an addressed memory cell where node C stores a logic zero value (in which case the transistor 17 will be turned on but the transistor 19 will be turned off).

These effects due to leakage can potentially give rise to a situation where even though the addressed memory cell stores a logic zero value at its node C, and accordingly the bit line $6_1$ should remain at the Vdd supply level during a read operation, the leakage current actually causes the voltage on the bit line to discharge, during the period in which the rwl signal is asserted on the read access circuit of the addressed storage cell, to an extent that the sense amplifier 12 flips its output state to a logic one (or High) value, thereby giving an incorrect read value.

To address or mitigate the effects of leakage currents a keeper circuit 16 is coupled to RBL $6_1$ where the keeper circuit 16 conceptually takes the form illustrated in 2b, where a series of transistor 18, 20, 22 is driven by a keeper enable signal (nEMAS) and a further transistor in series with transistors 18, 20, 22 is driven by the output signal 14 (nand_out) of the sense amplifier 12, such that when the series of transistors 18, 20, 22, 24 are enabled, the voltage on the RBL $6_1$ is pulled back towards the Vdd level. In this example, PMOS transistors are used, and hence the keeper enable signal (nEMAS) and output signal 14 (nand_out) of the sense amplifier 12 are asserted at a low logic level (e.g. 0) and de-asserted at a high logic level (e.g. 1).

The nEMAS signal and the EMAS, (where nEMAS is an inverted version of the EMAS signal) are keeper control signals provided as an external input to the storage system, for example from an application running in an associated circuit (e.g. central processor unit or graphics processor unit (not shown)).

As described above, there may be multiple columns in each bitcell array $2_1$ to $2_n$, where for example, and looking again at FIG. 1, the top bitcell array $2_1$ and bottom top bitcell array $2_2$ may each contain for example 16 storage cells within a column, and may comprise an RBL associated with each column, with read access circuitry $15_1$ to $15_p$ provided along the RBL to read a value in an associated storage cell 5. Each column in a pair of columns then provides a rbl signal to sensing circuitry 12 (depicted as a NAND gate) which outputs signal 14 responsive to the received rbl signals from the respective RBLs.

The output 14 from the sense circuit 12 is provided as an input signal for controlling an NMOS transistor 26, which, when enabled, provides a path to a voltage level (depicted as VSS) for GDL 28 to cause GDL 28 to provide a gdl signal to Q_latch control circuit 30.

Accordingly it will be seen that when any of the storage cells of a column include an addressed memory cell that stores a logic one value at its node C, then the sense circuit output 14 will transition to a logic one (HIGH) level during the read operation and hence turn on the corresponding NMOS transistor 26 that controls global data line (GDL) 28 to provide a gdl signal to latch circuit or Q_Latch circuit (hereafter latch circuit) 30.

Hence, the GDL 28 will be discharged towards a logic zero level when the addressed memory cell stores a logic one value at its node C. Otherwise, the gdl signal output will remain at a logic one level. The gdl signal can then be provided to a further circuit, such as the latch circuit 30 which outputs latch signal (QA) 36 to, for example, combination logic which is to register or capture the value on the RBL for the read operation (i.e. where QA is representative of the value taken to be stored in the addressed storage cell).

Latch circuit 30 receives the gdl signal output from the global bitline 28 (GDL) and, responsive to the gdl signal and latch control signal (Lat_e) 32 and latch control signal (Lat_en) 34, outputs latch signal (QA) 36. In the following examples the latch control signal 34 (latch enable signal or Lat_en) is an inverted version of latch control signal Lat_e 32, and both are taken to arrive at the latch circuit 30 substantially simultaneously. Furthermore, the latch enable signal 34 (Lat_en) or the signal Lat_e 32 may be both be referred to as a latch control signal.

Although only one RBL is depicted as providing an output to control the GDL 28 in FIG. 2b, it will be appreciated that each column of storage cells in the storage system has an associated RBL, sense circuit, GDL and latch circuit.

As set out above, the timing of the arrival of the latch enable signal 34 at the latch circuit 30 and the timing of the arrival of the gdl signal from the GDL is important for the performance of the storage system during read operations.

When the gdl signal arrives earlier than the latch enable signal 34 then the access time may be affected because the latch circuit won't register the value stored in the addressed storage cell until the latch enable signal is received (i.e. the storage system must wait for the latch enable signal 34).

On the other hand, when the latch enable signal 34 arrives earlier than the gdl signal and the QA is issued before the gdl signal is received the resulting QA signal 36 from the latch circuit 30 may cause a "Q glitch", where Q glitch is taken to be a voltage dip in an internal node of the latch circuit which may affect the performance of the storage system (e.g. where Q glitch may negatively impact power efficiency at the chip level (e.g. by increasing power consumption)). Furthermore, when the QA signal is issued before the gdl signal is received then a false transition may be registered by the combination logic (e.g. where a "1" is stored in the addressed storage cell but where the QA signal indicates that the a "0" value is stored in the addressed storage cell).

As an example of a false transition and Q glitch is described with reference to the example latch circuit 30 of FIG. 2c, where a gdl signal 28 is received as an input to a NAND gate 33, and the latch control signals 32, 34 are received as inputs to the transmission gate 35, and the output 39 of the transmission gate is provided as input to inverter 37.

As an illustrative example of operation, for a read operation where the output signal nQA (or QA bar as depicted in FIG. 2c) is a HIGH or 1, the gdl signal 28 for that read operation is also a HIGH logic value or 1; or where the output signal nQA is a LOW value or 0, the gdl signal 28 for that read operation is also a low logic value or 0.

In embodiments, the input to the latch circuit 30 may be precharged to a HIGH logic or 1, such that in steady state operation the first input 28 to the NAND gate 33 (depicted as D0) is precharged to a HIGH or 1 value. In steady state, the second input to NAND gate 33 (depicted as D1), may also be a static HIGH or 1 value.

When the latch control signals 32, 34 arrive earlier than the gdl signal 28, the transmission gate 35 will transfer the value at the output of the NAND gate 33 to the input of the inverter 37. When the gdl signal 28 from the GDL is 0 (as obtained from the RBL during the read operation), then the incorrect value will be provided to the input of the transmission gate 35. An incorrect value will then be provided from the output of the transmission gate 35 to the input of the inverter 37 because the value at the precharged input 28 is provided to the transmission gate 35 rather than the actual value which is obtained at the GDL during the read operation but which has not yet arrived at input 28. Thus, an incorrect value for the read operation will be provided as the output signal nQA, and an incorrect QA will be output from the latch circuit 30, and a false transition will be recorded.

As a further illustrative example, when a value LOW or 0 is obtained in a first read operation, a HIGH or 1 may be stored at the output of the transmission gate 35, depicted as internal node 39.

Following output of the output signal QA from the latch circuit for the first read operation, the precharge value (i.e. HIGH or 1) is provided as the input 28 to the NAND gate 33. In a second, subsequent read operation, when the latch control signals 32, 34 are received before the gdl signal for the second read operation, the transmission gate 35 will be enabled and, responsive to the HIGH or 1 precharge value at the input to the NAND gate 33, a LOW value or 0, will be output from the NAND gate 33 and pass through the transmission gates 35. Thus the value at the output node 39 of the transmission gate 35 begins to discharge to 0. However, when a LOW value or 0 is received as the gdl signal for the second read operation (before the latch output QA is generated), the LOW value or 0 gdl signal causes a HIGH or 1 value to be output from the NAND gate 33 and to pass through the transmission gate 35 causing the value at the node 39 to return to a HIGH value or 1, where the voltage dip from a HIGH value or 1 to a LOW value or 0 and back to a HIGH value can be seen to be a Q glitch.

An example of a Q glitch is depicted in the waveform 40 of FIG. 3, where the glitch can be seen as a dip on the voltage waveform which in FIG. 3 is depicted to be up to ~25% of the supply voltage. Whilst FIG. 3 depicts the dip as being up to ~25% of the supply voltage, the Q glitch may be up to 100% of the supply voltage, where a Q glitch can result in power inefficiencies during operation (e.g. by increasing power consumption). Furthermore, when the Q glitch is ~100% of the supply voltage a false transition may occur. In FIG. 3, time (nanoseconds (ns)) is depicted on the X-axis and voltage (millivolts mV) is depicted on the Y-axis.

Thus, there may be a delay in signal propagation along the GDL when a keeper circuit is enabled in comparison to when the keeper circuit is disabled. Therefore, the arrival of the gdl signal at the latch circuit may be delayed when the keeper circuit is enabled in comparison to when the keeper circuit is disabled. Such a delay in the arrival of the gdl signal at the latch circuit may result in a Q glitch and/or a false transition.

The present techniques are concerned with improving the timing of the latch enable signal and/or the gdl signal arriving at the latch circuit 30.

During read operations, the latch enable signal 34 should arrive at the latch circuit 30 at substantially the same time as the gdl signal to provide efficient and reliable operation, and to ensure the legitimacy or validity of the QA signal. As an example, the latch enable signal 34 should arrive at the latch circuit 30 within (±) one or more nano seconds (ns) of the gdl signal. As a further example, the latch enable signal 34 should arrive at the latch circuit 30 within (±) one or more pico-seconds (ns) of the gdl signal. As a still further example, the latch enable signal 34 should arrive at the latch circuit 30 within (±) one or more femto-seconds (fs) of the gdl signal.

Figure 4A:
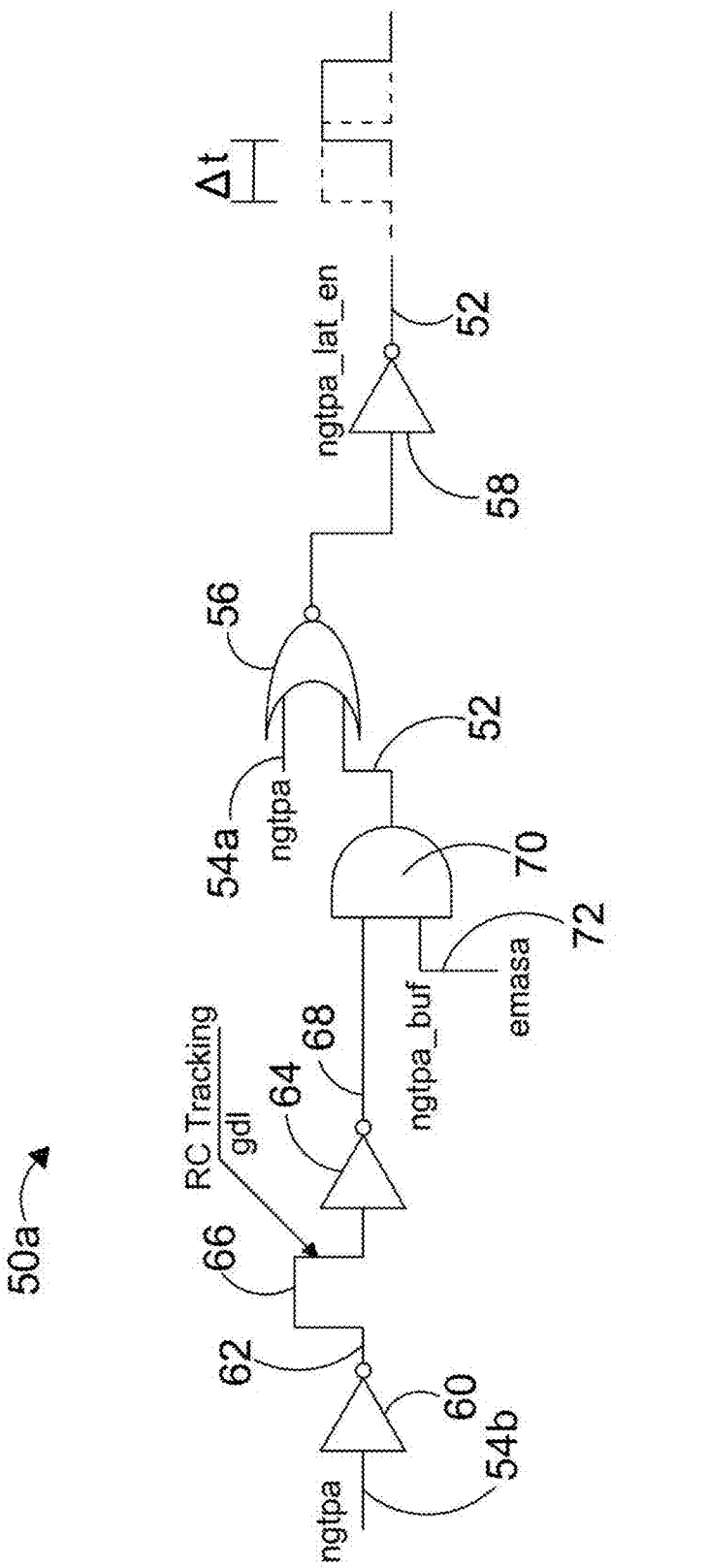
FIG. 4a shows a component level diagram of latch control circuit in accordance with the present techniques.
Figure 4B:
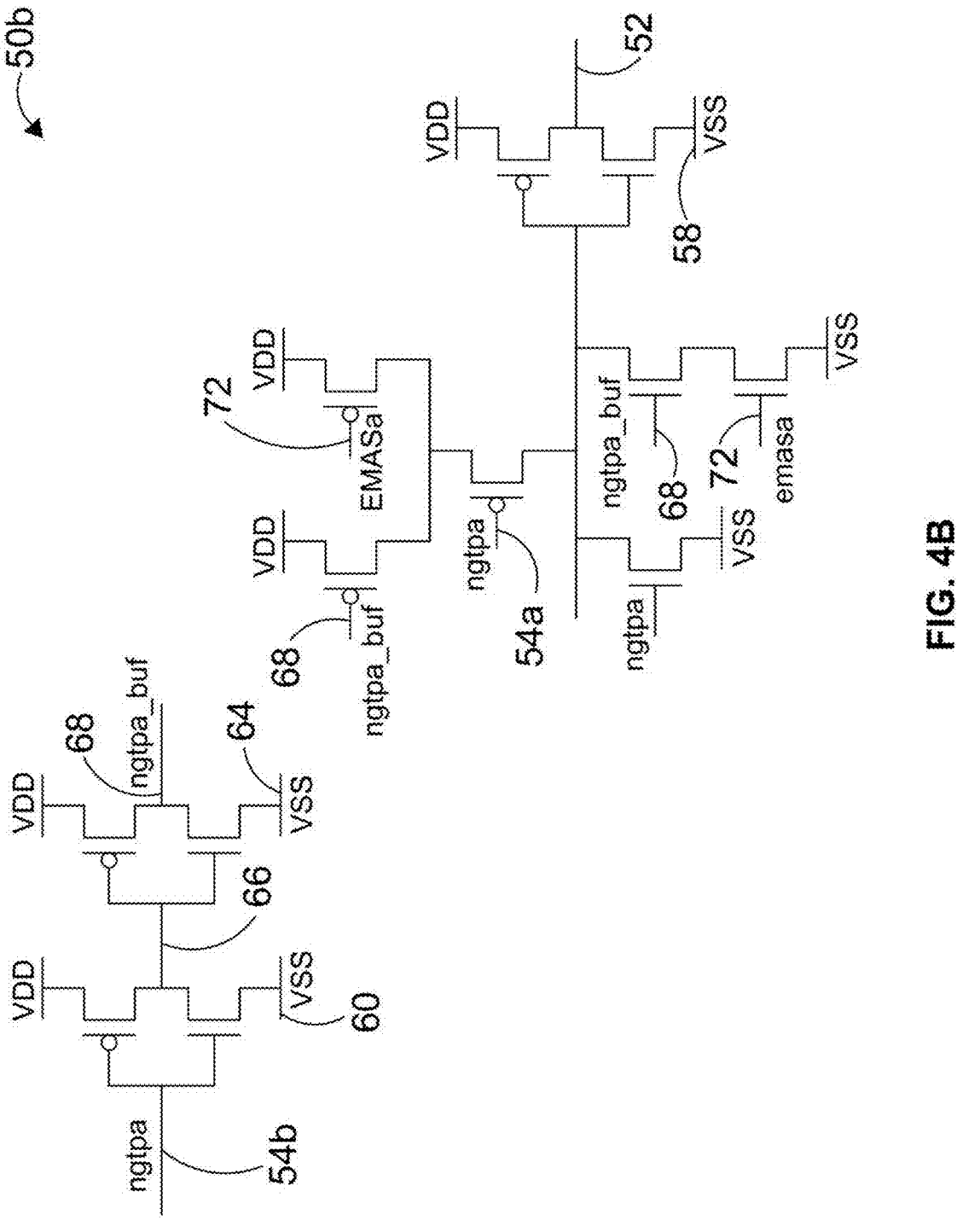
FIG. 4b shows an example transistor level diagram of the latch control circuit of FIG. 4a in accordance with the present techniques.

In accordance with the present techniques, a component level diagram of latch control circuit 50a which provides for control of the arrival of the latch control signal (e.g. latch enable) at the latch circuit is schematically shown in FIG. 4a, and a corresponding CMOS transistor level circuit 50b of latch control circuit 50a is schematically shown in FIG. 4b. The same numbering will be used for similar components in circuits 50a and 50b. FIG. 4a depicts an illustrative example of a latch control circuit having two different signal propagation paths, and where one propagation path delays a signal propagating there through compared to the other. It will be appreciated that the latch control circuit can take any configuration/arrangement and the claims are not limited to the circuitry, components or elements depicted in FIG. 4a or 4b.

Latch control circuit 50a, 50b is configured to output latch enable signal (ngpta_lat_en) 52 responsive to the input signal ngtpa 54. The input signal ngtpa is based on the gtp signal generated by clock generation circuitry (in that in the present example, ngtpa it is the inverted gtp signal) and is asserted when a read operation is initiated. Latch enable signal (ngpta_lat_en) 52 is provided to the latch circuit and corresponds to latch enable signal 34 described above in FIG. 2b.

The latch control circuit 50a, 50b has two modes of operation where, in a first mode, the input signal ngtpa 54 is provided as an input to NOR gate 56, and where the NOR gate output is inverted by inverter 58 to provide the latch enable signal (ngpta_lat_en) 52.

In a second mode, the input signal ngtpa 54 is provided as an input to an inverter 60. The output 62 of inverter 60 is provided as an input to further inverter 64 via a delay line 66. The delay line 66 comprises properties or characteristics that are set during the phase as will be described in detail below.

The inverter 64 outputs buffered signal ngtpa_buf which is provided as a first input to AND gate 70. A second input of AND gate 70 comprises emasa signal 72, which is based on the keeper enable signal (nEMAS) described above. For example, signal emasa used as the input to AND gate 70 may be an inverted version of the keeper enable signal nEMSA.

The output 72 of AND gate 70 is provided as a further input to NOR gate 56 and, as above in the first mode of operation, the NOR gate output is inverted by inverter 58 to provide the latch enable signal (ngpta_lat_en) 52.

The latch control circuit 50a, 50b is configured to operate in the first mode of operation when the keeper circuit associated with the RBL (as described above) is disabled i.e. when emasa is LOW or "0", and to operate in the second mode of operation when the keeper circuit is enabled i.e. when emasa is HIGH or "1".

Thus, in the first mode of operation, when the keeper circuit associated with the RBL is disabled, the latch control circuit 50a, 50b generates latch enable signal (ngpta_lat_en) 52 responsive to the input signal ngtpa 54a along a first signal path comprising the NOR gate 56 and inverter 58 whereas in the second mode of operation, when the keeper circuit associated with the RBL is enabled, the latch control circuit 50a, 50b generates latch enable signal (ngpta_lat_en) 52 responsive to the input signal ngtpa 54b input along a second signal path comprising inverter 60, delay line 66, inverter 64, AND gate 70, NOR gate 56 and inverter 58.

The signal propagation along the second signal propagation path is longer than the signal propagation along the first signal path so the latch enable signal (ngpta_lat_en) 52 will be output quicker responsive to input signal ngtpa 54a than for input signal 54b.

Thus, as the gdl signal will be delayed when the keeper circuit is enabled compared to when the keeper circuit is disabled, the latch control circuit 50a, 50b will delay output of the latch enable signal (ngpta_lat_en) 52 when the keeper circuit is enabled.

The properties or characteristics of the latch control circuit 50a, 50b are set or tuned or selected (hereafter "set") to delay the output of the ngtpa_lat_en signal by a time Δt so that the arrival of ngpta_lat_en at the latch circuit substantially coincides with the gdl signal (or as required), thereby taking account of the propagation delay experienced by the gdl signal due to the keeper circuit being enabled.

For example, characteristics or properties of the second signal propagation path may be set to provide the delay (e.g. by setting a length of the delay line 66, using particular materials for the delay line (e.g. materials having reduced conductivity) and/or adding other components, circuitry or elements along the second signal propagation path).

The required delay may be determined at the design and test phase prior to manufacture of the circuit and the properties or characteristics of the propagation signal line manufactured in the manufactured circuit accordingly.

For example, a length of the delay line 66 required to provide a required delay may be determined, and the length of the delay line set in the design and the design line manufactured to the design accordingly. Additionally, or alternatively, the delay line may comprise materials having a relatively higher resistance so as to delay propagation to a required amount. In a further example, further logic (e.g. inverters) may be provided along the second signal propagation path to provide such a delay.

Thus, by delaying the output of the ngpta_lat_en signal 52 when the keeper circuit is enabled means that the Q glitch that would otherwise be experienced is reduced or avoided, thereby saving power during operation (e.g. by reducing power consumption that would otherwise be experienced by a larger Q glitch). Such power savings may be desirable for different types of storage systems such as, for example, cache storage systems. Furthermore, delaying the output of the ngpta_lat_en signal 52 when the keeper circuit is enabled means that the likelihood or risk of a false transition being registered is reduced. Furthermore still, by coordinating the arrival of the gdl signal and the ngpta_lat_en signal the access time may be reduced compared to the gdl signal arriving a length of time before or after the ngpta_lat_en signal.

For example, the properties or characteristics of the second propagation path may be set so that the latch enable signal arrives at the latch circuit as required (e.g. as required by a particular application).

For example, the delay may be set so that the latch enable signal 52 arrives at the latch circuit at substantially the same time as the gdl signal. As an example, the delay may be set so that latch enable signal is to arrive at the latch circuit within (±) one or more nano seconds (ns) of the gdl signal. As a further example, the delay may be set so that latch enable signal is to arrive at the latch circuit 30 within (±) one or more pico-seconds (ns) of the gdl signal. As a still further example, the delay may be set so that latch enable signal is to arrive at the latch circuit 30 within (±) one or more femto-seconds (fs) of the gdl signal. Although in some examples the properties or characteristics of a signal propagation path can be set to slow the propagation of the gtp (or ngtp) through the propagation path so that the latch enable signal 52 is set to arrive at the latch circuit at substantially the same time as the gdl signal, the claims are not limited in this regard, and the properties or characteristics may be set to control the arrival of the latch enable signal relative to the gdl signal as required (e.g. by a particular customer).

Table 1 shows the access time for a storage system having a latch control circuit have two modes of operation. As can be seen from Table 1, the RBL discharge delay with the keeper enabled is increased (39.11 ps) in comparison to when the keeper circuit is disabled (33.66), providing delta (or difference) of 5.45 ps.

The total access time with the keeper enabled is increased (125.67 ps) in comparison to when the keeper circuit is disabled (120.18 ps), providing a Delta (or difference) of 5.49 ps Generally, a read margin or latch clock margin may be set or enforced to take account of the latch enable signal arriving early (i.e. where the margin may cause the latch clock to wait the defined margin before outputting the latch signal (QA)). Such a read margin could cause result in access time (the time taken for a latch circuit to issue QA). Thus, the read margin can be seen as a penalty. However, as the difference in access time is within 0.04 ps, the latch control circuit avoids the need for any additional read margin to be enforced.

TABLE 1

| parameter/corer | EMASA = 1 (keeper enabled) S5/0.9 V/125 c | EMASA = 0 (keeper disabled) SS/0.9 V/125 c | Delta |
|---|---|---|---|
| readbitline discharge delay(ps) | 39.11 | 33.66 | 5.45 |
| total accesstime(ps) | 125.67 | 120.18 | 5.49 | ps → pico seconds

Figure 5:
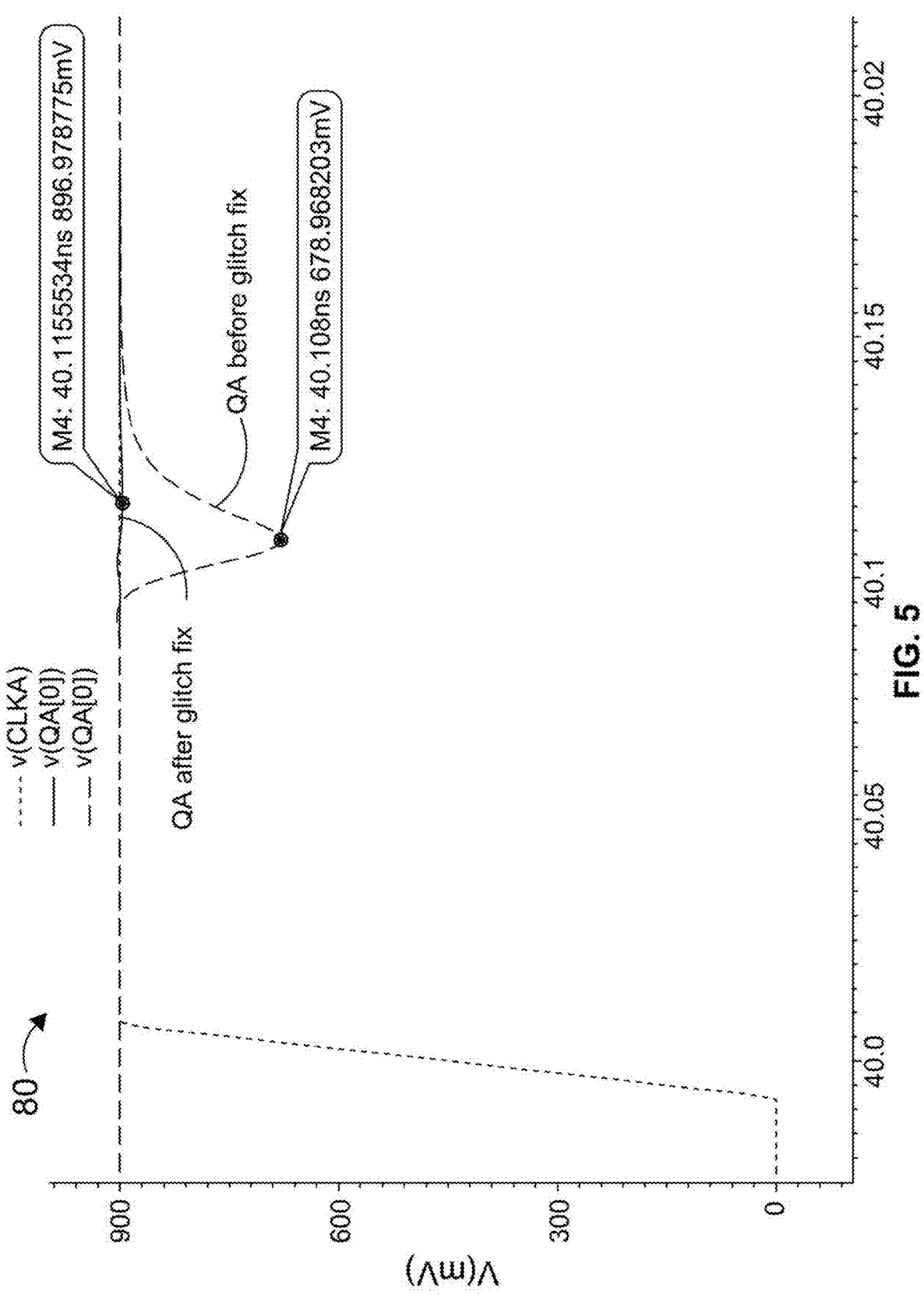
FIG. 5 is a graph which is representative of an internal node of a latch circuit during a latch operation in accordance with the present techniques.

Furthermore, an example of a Q glitch experienced in a storage system using the present techniques is depicted in the waveform 80 of FIG. 5, where the waveform marked "QA before glitch fix" represents signals generated in a storage system having a latch control circuit having only one signal propagation path and where the keeper circuit is enabled, and the waveform marked "QA after glitch fix" represents QA signals generated in a storage system having a latch control circuit comprising a signal propagation path to delay a signal when a keeper circuit is enabled according to the present techniques.

In the waveform marked "QA after glitch fix" the Q glitch is ~2% of the supply voltage, which shows a significant improvement over the waveform marked "QA before glitch fix" and that depicted in FIG. 3.

The reduction in Q glitch is evident when the performance of the periphery circuits (e.g. clock generation circuitry and/or sense circuitry) of the storage system are tested at the typical-typical (tt) corner and the performance of the bitcell array is tested at the slow-slow (ss) corner.

In FIG. 5, time (nanoseconds (ns)) is depicted on the X-axis and voltage (millivolts mV) is depicted on the Y-axis.

Figure 6:
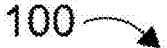
FIG. 6 is a flow diagram for of a method for operating a latch control circuit in accordance with the present techniques.
Figure 6:
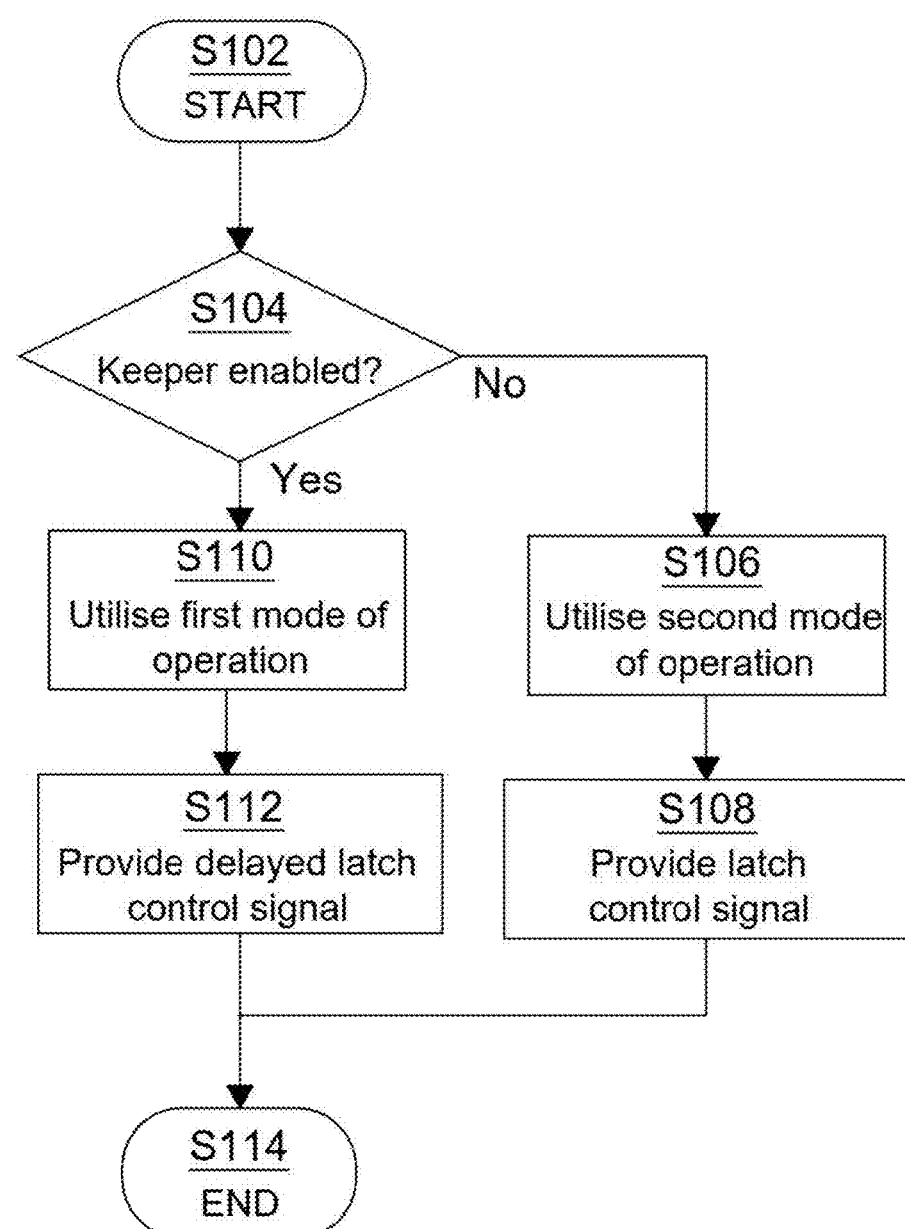

FIG. 6 is a flow diagram for of a method 100 for operating a latch control circuit in accordance with the present techniques.

At S102 the method starts.

At S104 when a read operation for a storage cell is initiated and the keeper circuit is not enabled, the latch control circuit at S106 operates in a first mode and utilizes a first signal propagation path from latch control circuit is output.

At S108 the latch control circuit outputs latch control signal to latch a circuit.

At S104 when a read operation for a storage cell is initiated and the keeper circuit is enabled, the latch control circuit at S110 operates in a second mode and utilizes a second signal propagation path from latch control circuit is output.

At S112 the latch control circuit outputs the latch control signal to the latch circuit.

At S114 the method ends.

The second propagation path comprises a delay line, where the properties or characteristics of the delay line are tuned or selected to delay the output of the latch control signal by a time Δt so that the arrival of the latch control signal at the latch circuit substantially coincides with the gdl signal (or where the latch control signal arrives at the latch circuit relative to the gdl signal as required), thereby taking account of the propagation delay experienced by the gdl signal due to the keeper circuit being enabled. The required delay may be determined at the design and test phase prior to manufacture and one or more properties or characteristics of the signal propagation path (e.g. one or more properties or characteristics delay line) manufactured in accordance with the design.

Figure 7:
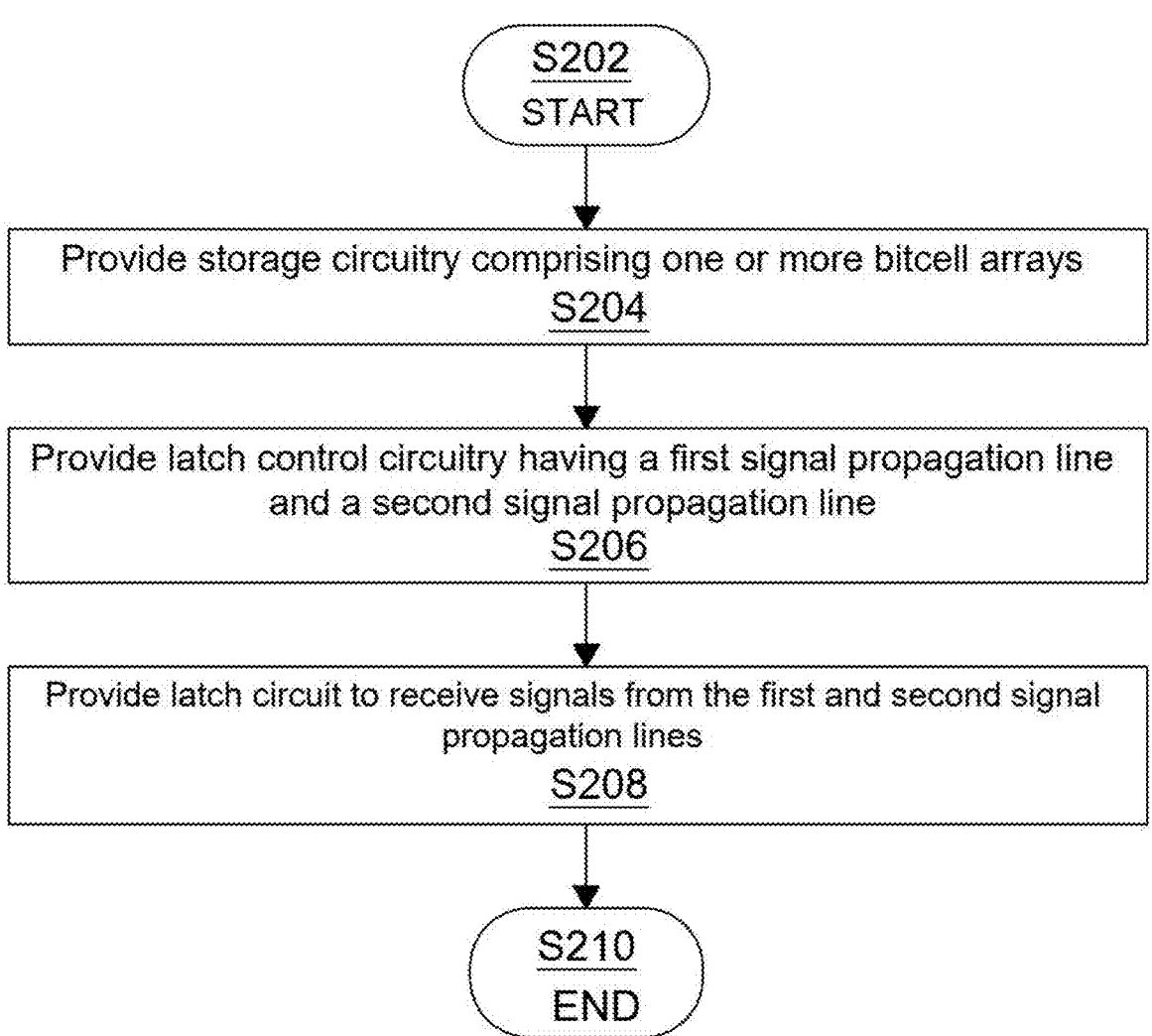
FIG. 7 is a flow diagram for providing a storage system in accordance with the present techniques.

FIG. 7 illustrates a flow diagram of a method 200 for providing a storage system in accordance with various implementations described herein.

It should be understood that even though method 200 may indicate a particular order of operation execution, in some cases, various certain portions of the operations may be executed in a different order, and on different systems. In other cases, additional operations and/or steps may be added to and/or omitted from method 200.

Also, method 200 may be implemented in hardware and/or software. When implemented in hardware, the method 200 may be implemented with various circuit elements, such as described herein above in reference to FIGS. 4*a* & 4*b*. When implemented in software, the method 200 may be implemented as a program and/or software instruction process that may be configured for providing DBL design techniques as described herein. Also, if implemented in software, instructions related to implementing the method 200 may be stored in memory and/or a database. For instance, a computer or various other types of computing devices having a processor and memory may be configured to perform method 200.

As described and shown in reference to FIG. 7, method 200 may be utilized for fabricating and/or manufacturing, or causing to be fabricated and/or manufactured, an integrated circuit (IC) that implements a design scheme and techniques as described herein that are related to providing latch control architecture and/or various associated systems, devices, components, circuits and related architecture.

At S202, method 200 starts and at S204 may provide storage circuitry with one or more bitcell arrays, each bitcell array comprising a plurality of storage cells arranged in columns and rows.

At S206, method 200 may provide, latch control circuitry having a first signal propagation line and a second signal propagation line, each having various circuitry or components (e.g. transistors, diodes etc). In a first mode of operation, an input signal (e.g. ngtpa) may be provided as an input to the latch control circuit to propagate through the first signal propagation line and output to a latch circuit.

In a second mode of operation, the input signal (e.g. ngtpa) may be provided as an input to the latch control circuit to propagate through the second signal propagation line and output to a latch circuit, where the output signal from the second signal line may be delayed relative to the output from first signal line by a specified delay or amount of time (Δt). The specified amount of time by which the output from the second signal line may be delayed relative to the output of the first signal line is based on or in response to one or more properties or characteristics of the second propagation line determined, for example, a test phase prior to manufacture of the IC. For example, the delay Δt may be based on or in response to the length of a delay line along the second propagation line.

At S208, method 200 may provide a latch circuit to receive, during a read operation, the output from one of the first signal line and the second signal line, and to receive an output from a global data line.

At S210, method 200 ends.

The latch control circuit provides tuning of latch control signals to take account of a delay experienced by the gdl signal when a keeper circuit is enabled during a read operation. Such functionality may reduce the effects of Q glitch and may avoid false transitions when the latch control signal arrives at the latch circuit before the gdl signal.

As will be appreciated by one skilled in the art, the present technology may be embodied as a method, a circuit or a computer readable medium comprising data and imperatives to cause construction of a circuit. Accordingly, the present technique may take the form of an entirely hardware embodiment, an entirely software embodiment, or an embodiment combining software and hardware. Where the word "component" is used, it will be understood by one of ordinary skill in the art to refer to any portion of any of the above embodiments.

The latch circuitry can be used in a memory system where the present techniques described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The present techniques described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Figure 8:
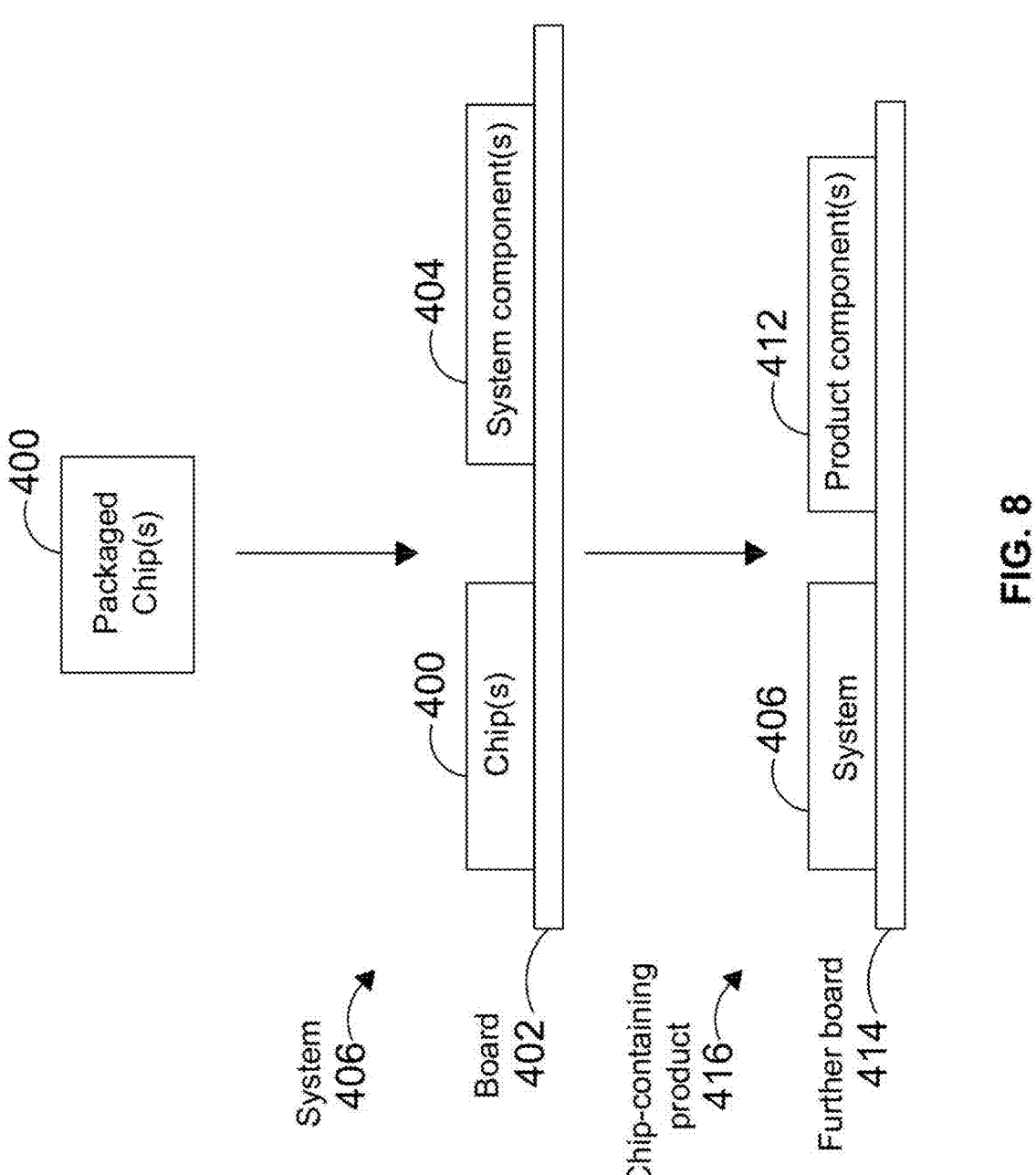
FIG. 8 shows a system and a chip-containing product.

As an illustrative example, as shown in FIG. 8, one or more packaged chips 400, with the circuitry described above implemented on one chip or distributed over two or more of the chips, may be manufactured by a semiconductor chip manufacturer. In some examples, the chip product 400 made by the semiconductor chip manufacturer may be provided as a semiconductor package which comprises a protective casing (e.g. made of metal, plastic, glass or ceramic) containing the semiconductor devices implementing the circuitry described above and connectors, such as lands, balls or pins, for connecting the semiconductor devices to an external environment. Where more than one chip 400 is provided, these could be provided as separate integrated circuits (provided as separate packages), or could be packaged by the semiconductor provider into a multi-chip semiconductor package (e.g. using an interposer, or by using three-dimensional integration to provide a multi-layer chip product comprising two or more vertically stacked integrated circuit layers).

In some examples, a collection of chiplets (i.e. small modular chips with particular functionality) may itself be referred to as a chip. A chiplet may be packaged individually in a semiconductor package and/or together with other chiplets into a multi-chiplet semiconductor package (e.g. using an interposer, or by using three-dimensional integration to provide a multi-layer chiplet product comprising two or more vertically stacked integrated circuit layers).

The one or more packaged chips 400 are assembled on a board 402 together with at least one system component 404 to provide a system 406. For example, the board may comprise a printed circuit board. The board substrate may be made of any of a variety of materials, e.g. plastic, glass, ceramic, or a flexible substrate material such as paper, plastic or textile material. The at least one system component 404 comprise one or more external components which are not part of the one or more packaged chip(s) 400. For example, the at least one system component 404 could include, for example, any one or more of the following:

another packaged chip (e.g. provided by a different manufacturer or produced on a different process node), an interface module, a resistor, a capacitor, an inductor, a transformer, a diode, a transistor and/or a sensor.

A chip-containing product 416 is manufactured comprising the system 406 (including the board 402, the one or more chips 400 and the at least one system component 404) and one or more product components 412. The product components 412 comprise one or more further components which are not part of the system 406. As a non-exhaustive list of examples, the one or more product components 412 could include a user input/output device such as a keypad, touch screen, microphone, loudspeaker, display screen, haptic device, etc.; a wireless communication transmitter/receiver; a sensor; an actuator for actuating mechanical motion; a thermal control device; a further packaged chip; an interface module; a resistor; a capacitor; an inductor; a transformer; a diode; and/or a transistor. The system 406 and one or more product components 412 may be assembled on to a further board 414.

The board 402 or the further board 414 may be provided on or within a device housing or other structural support (e.g. a frame or blade) to provide a product which can be handled by a user and/or is intended for operational use by a person or company.

The system 406 or the chip-containing product 416 may be at least one of: an end-user product, a machine, a medical device, a computing or telecommunications infrastructure product, or an automation control system. For example, as a non-exhaustive list of examples, the chip-containing product could be any of the following: a telecommunications device, a mobile phone, a tablet, a laptop, a computer, a server (e.g. a rack server or blade server), an infrastructure device, networking equipment, a vehicle or other automotive product, industrial machinery, consumer device, smart card, credit card, smart glasses, avionics device, robotics device, camera, television, smart television, DVD players, set top box, wearable device, domestic appliance, smart meter, medical device, heating/lighting control device, sensor, and/or a control system for controlling public infrastructure equipment such as smart motorway or traffic lights.

As will be appreciated by one skilled in the art, the present technology may be embodied as a method, a circuit or a computer readable medium comprising data and imperatives to cause construction of a circuit. Accordingly, the present technique may take the form of an entirely hardware embodiment, an entirely software embodiment, or an embodiment combining software and hardware. Where the word "component" is used, it will be understood by one of ordinary skill in the art to refer to any portion of any of the above embodiments.

Concepts described herein may be embodied in computer-readable code for fabrication of an apparatus that embodies the described concepts. For example, the computer-readable code can be used at one or more stages of a semiconductor design and fabrication process, including an electronic design automation (EDA) stage, to fabricate an integrated circuit comprising the apparatus embodying the concepts. The above computer-readable code may additionally or alternatively enable the definition, modelling, simulation, verification and/or testing of an apparatus embodying the concepts described herein.

For example, the computer-readable code for fabrication of an apparatus embodying the concepts described herein can be embodied in code defining a hardware description language (HDL) representation of the concepts. For example, the code may define a register-transfer-level (RTL)

abstraction of one or more logic circuits for defining an apparatus embodying the concepts. The code may define an HDL representation of the one or more logic circuits embodying the apparatus in Verilog, SystemVerilog, Chisel, or VHDL (Very High-Speed Integrated Circuit Hardware Description Language) as well as intermediate representations such as FIRRTL. Computer-readable code may provide definitions embodying the concept using system-level modelling languages such as SystemC and SystemVerilog or other behavioral representations of the concepts that can be interpreted by a computer to enable simulation, functional and/or formal verification, and testing of the concepts.

Additionally, or alternatively, the computer-readable code may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying the invention. Alternatively or additionally, the one or more logic synthesis processes can generate from the computer-readable code a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code may comprise a mix of code representations for fabrication of an apparatus, for example including a mix of one or more of an RTL representation, a netlist representation, or another computer-readable definition to be used in a semiconductor design and fabrication process to fabricate an apparatus embodying the invention. Alternatively, or additionally, the concept may be defined in a combination of a computer-readable definition to be used in a semiconductor design and fabrication process to fabricate an apparatus and computer-readable code defining instructions which are to be executed by the defined apparatus once fabricated.

Such computer-readable code can be disposed in any known transitory computer-readable medium (such as wired or wireless transmission of code over a network) or non-transitory computer-readable medium such as semiconductor, magnetic disk, or optical disc. An integrated circuit fabricated using the computer-readable code may comprise components such as one or more of a central processing unit, graphics processing unit, neural processing unit, digital signal processor or other components that individually or collectively embody the concept.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

In the present application, lists of features preceded with the phrase "at least one of" mean that any one or more of those features can be provided either individually or in combination. For example, "at least one of: [A], [B] and [C]" encompasses any of the following options: A alone (without B or C), B alone (without A or C), C alone (without A or B), A and B in combination (without C), A and C in combination (without B), B and C in combination (without A), or A, B and C in combination.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope of the invention as defined by the appended claims.

The invention claimed is:

1. A storage system comprising:
a bitcell array comprising a plurality of storage cells arranged in one or more columns and one or more rows;
a latch circuit configured to output a latch signal responsive to a latch control signal and a data signal from a global data line during a read operation of a storage cell of the plurality of storage cells;
a latch control circuit configured to provide the latch control signal to the latch circuit, where the latch control circuit comprises a first signal propagation path for a first mode of operation and a second signal propagation path for a second mode of operation, and wherein the first signal propagation path is to delay propagation of a pulse signal through the first signal propagation path by a time ($\Delta t$) compared to a propagation of the pulse signal through the second propagation path,
wherein one or more properties or characteristics of the first signal propagation path are set to delay the pulse signal by $\Delta t$, and wherein the first signal propagation path is enabled responsive to a keeper control signal.

2. The system of claim 1, wherein a property or characteristic of the one or more properties or characteristics comprises a length of a delay line along the first signal propagation path.

3. The system of claim 1, wherein a property or characteristic of the one or more properties or characteristics comprises a material of a delay line along the first signal propagation path.

4. The system of claim 1, wherein a property or characteristic of the one or more properties or characteristics comprises one or more additional components, circuitry or elements along the first signal propagation path compared to the second signal propagation path.

5. The system of claim 1, wherein the pulse signal output from the latch control circuit comprises the latch control signal.

6. The system of claim 5, wherein the latch control signal comprises a latch enable signal.

7. The system of claim 1, wherein the pulse signal comprises a global timing pulse received at an input of the first signal propagation path or the second signal propagation path dependent on the mode of operation.

8. The system of claim 1, wherein the latch circuit is configured to generate the latch signal responsive to the latch control signal and the data signal.

9. The system of claim 1, wherein, for the second mode of operation, the latch control circuit is configured to provide the latch control signal to the latch circuit, where the latch control signal is to arrive at the latch circuit at substantially the same time as the data signal.

10. The system of claim 1, wherein the system comprises a single ended storage system.

11. A latch control circuit for a storage system configured to provide:

a latch control signal to a latch circuit, where the latch control circuit comprises a first signal propagation path for a first mode of operation and a second signal propagation path for a second mode of operation, and where the first signal propagation path is to delay propagation of a pulse signal through the first signal propagation path by a time $\Delta t$ compared to a propagation of the pulse signal through the second propagation path, wherein one or more properties or characteristics of the first signal propagation path are configured to delay the pulse signal by $\Delta t$, and wherein the first signal propagation path is enabled responsive to a keeper control signal.

12. The latch control circuit of claim 11, wherein a property or characteristic of the one or more properties or characteristics comprises a length of a delay line along the first signal propagation path.

13. The latch control circuit of claim 11, wherein a property or characteristic of the one or more properties or characteristics comprises a material of a delay line along the first signal propagation path.

14. The latch control circuit of claim 11, wherein a property or characteristic of the one or more properties or characteristics comprises one or more additional components, circuitry or elements along the first signal propagation path compared to the second signal propagation path.

15. A method of operating a storage system, the storage system comprising a latch control circuit to provide a latch control signal to a latch circuit during a read operation, the latch circuit having a first mode of operation and second mode of operation, the method comprising:

providing a pulse signal as an input to a first signal propagation path in the first mode of operation or providing the pulse signal as an input to a second signal propagation path in a second mode of operation, wherein the first signal propagation path is to delay propagation of the pulse signal through the first signal propagation path by a time $\Delta t$ compared to propagation of the pulse signal through the second signal propagation path, wherein one or more properties or characteristics of the first signal propagation path are configured to delay the pulse signal by $\Delta t$, and wherein the first signal propagation path is enabled responsive to a keeper control signal.

* * * * *